United States Patent [19]

Robinson

[11] Patent Number: 4,722,025
[45] Date of Patent: Jan. 26, 1988

[54] GROUND LATCH AND CASE

[76] Inventor: Will B. Robinson, 38 Bernard Avenue, Toronto, Ontario, Canada, M5R 1R2

[21] Appl. No.: 909,644
[22] Filed: Sep. 22, 1986
[51] Int. Cl.$^4$ ............................................. H05F 3/02
[52] U.S. Cl. ..................................... 361/212; 206/328
[58] Field of Search ................... 361/212, 215, 220; 206/328

[56] References Cited

U.S. PATENT DOCUMENTS 4,494,651 1/1985 Malcolm .......................... 361/212 X Primary Examiner—L. T. Hix
Assistant Examiner—Brian W. Brown
Attorney, Agent, or Firm—Kenneth M. Garrett

[57] ABSTRACT

A lined metal box for the containment and possible transportation of solid state electronic components is provided with a lid having a key-actuated securing latch therefor. In order to assure that no high voltage can be applied to the case, and more particularly its contents during the transfer thereof, the key for the metal case is provided with a grounding so adapted to ensure grounding of the case before the lid can be released and the contents therein made accessible. The box lining comprises an electrically conductive foam lining, to ensure that no cumulative electrostatic charge can build up, as all such charges leak to the box structure. At the time of unloading the box, the box is grounded and all electrostatic potentials are effectively reduced to the ground value.

7 Claims, 3 Drawing Figures

GROUND LATCH AND CASE

BACKGROUND OF THE INVENTION

This invention is directed to a latchable container, and in particular to a container having ground means associated therewith to remove any electrical charge from the container.

The storage and transportation of some electronic components require certain precautions against the presence of electrical fields and the generation of rapid electrical discharges. In particular solid state circuits such as computer chips are susceptible to damage as a consequence of exposure to discharges from high potential electrostatic fields, to the extent that a chip can be rendered ineffective and valueless. Accordingly, the existence of any such high potential electrostatic field in proximity to the electronic components is nullified by the step of grounding out the container within which the susceptible electronic components are stored or transported.

SUMMARY OF THE INVENTION

In view of the widespread scope of usage for the subject container a key actuated tumbler-less latching device has been adopted wherein the key is grounded by a grounding cable and wherein insertion of the key will automatically interconnect the grounding cable in discharging relation with the conductive container.

While a metal box having a metal piano hinge and a metal lid therefor provides a simple, low cost, readily manufactured robust product very well suited to the purposes of the present invention, it will be understood that alternative constructions of electrically conductive material, possibly non-metallic, may be readily substituted, both for the container, and the grounding key therefor.

The interior of the subject container may comprise a suitable shock-insulative lining. One type of material comprises a synthetic plastic foam. Such foams are commercially available, having a controlled extent of conductivity or non-conductivity, wherein:

"conductive foam" is defined in the range (ohms per square)$\times 10^{-7}$ to $10^5$ "charge dissipative foam" is defined in the range (ohms per square) $\times 10^5$ to $10^9$ "anti static foam" is defined in the range (ohms per square)$\times 10^9$ to $10^{14}$ (slow discharge rate)

"insulating foam" is defined in the range (ohms per square)$\times$ greater than $10^{14}$ The present invention thus provides an electrically conductive container having a body portion and a lid closure therefore, key releasable latch means for retaining the lid in secured relation to the body portion making electrical contact with the body portion and the lid, key means for releasing the latch means, the key means making electrical contact with the latch means, and ground cable means connected with the key means to remove any charge above ground potential whereby upon insertion of the key in the latch means the container is effectively grounded and any electrostatic charge thereon is removed.

A further embodiment incorporates a mechanical shock insulative foam lining of predetermined electrical resistivity. The latch means embodiment of the subject container comprises a clip means secured to the body portion of the container, having a projecting edge which engages a grommet means secured to a lid closure, the grommet means having an aperture therethrough, through which can penetrate an end portion of a key when inserted into the grommet, to displace the clip portion of the latch means from off the grommet means, to release the lid closure while simultaneously grounding the container by way of the key.

The present invention thus further provides the method of protecting sensitive solid state electronic components comprising the steps of inserting the components within an electrically conductive container, closing the container and latching the container with a key releasable latch, subsequently retrieving the components by grounding the container to release any accumulated electrostatic charge while simultaneously releasing the latch, and obtaining the components from within the container.

BRIEF DESCRIPTION OF THE DRAWINGS

Certain embodiments are described, reference being made to the accompanying drawings, wherein.

DESCRIPTION OF THE PREFERRED EMBODIMENT

Figure 1:
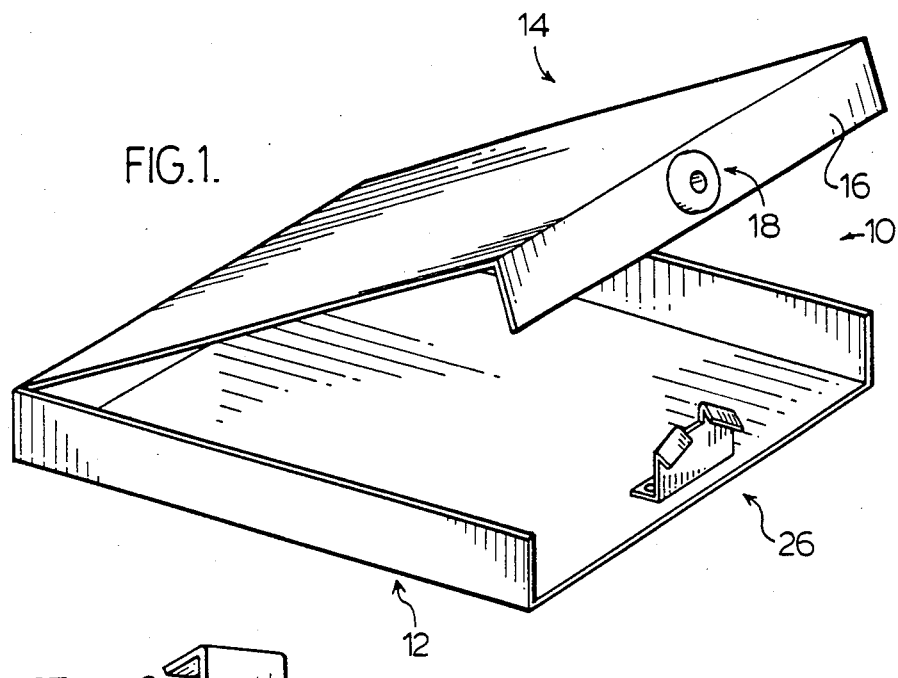
FIG. 1 is a general view of a simple container incorporating the subject invention, when in an open condition.
Figure 2:
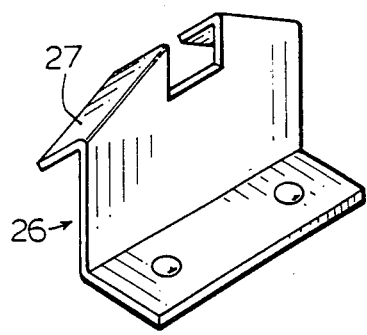
FIG. 2 is a side elevational view of a front portion of the subject container in sectioned relation having the grounding key in position for insertion into the latch thereof.
Figure 3:
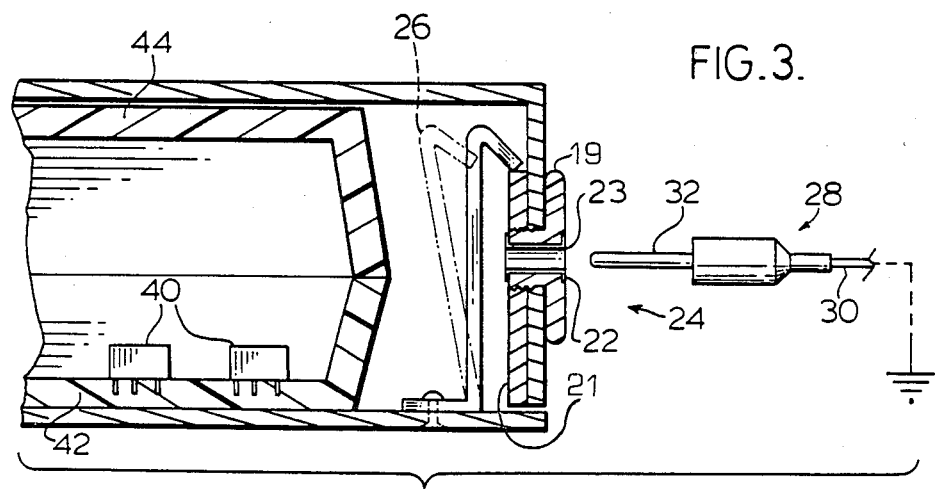
FIG. 3 is a general view of the clip means of FIG. 1.

Referring to FIGS. 1, 2 and 3 the container 10 has a body portion 12 and a lid portion 14 hingedly attached thereto by a continuous piano hinge (not shown). The lid 14 has a rigid front edge portion 16 having a grommet means 18 secured thereto. The grommet means 18 comprises an outer washer 19, an inner washer 21 and a sleeve 22 rivetted therethrough so as to sandwich the front edge 16 between washers 19 and 21. The sleeve 22 has an inner bore 23 extending therethrough.

The latch means 24 includes the grommet means 18 and resilient clip means 26 shown rivetted to the body portion 12. The clip means 26 has a pair of forwardly extending, downwardly inclined top edge portions 27. The top edge portions 27 engage the inner washer 21, to secure the cover in aligned relation.

A key 28 of electrically conductive material such as brass has a ground cable 30 secured thereto. The key 28 has a tip portion 32 which can be inserted through the bore 23 of sleeve 22 so as to contact the front face of clip means 26 to displace the edge portion 27 away from the inner washer 21. In this condition the latch 18 is effectively grounded, thereby grounding the container 10 while the latch 18 is simultaneously released from the grommet 18, permitting the box to be opened.

The downward inclination of the edge portion 27 permits closure of the container, due to deflection of the clip means 26 by the grommet means 18, on contacting the inclined surface of edge 27.

Electronic components 40 are shown enclosed by foam pads 42, 44 which afford mechanical cushioning therefor and a predetermined extent of electrical insulation, dependent upon the conductive (including insulative) characteristics of the selected foam material.

It is usual to cushion the components by way of a suitable cushioning when transportation thereof is involved. The cushioning is effected utilizing a foam possessing a predetermined electrical conductivity characteristic.

While the illustrated embodiments of container and grounding key are metal, electrically conductive cardboards such as COROSTAT(T.M.) are readily available having a conductive coating thereover. In addition, suitable, electrically conductive plastic are readily available which possess appropriate mechanical characteristics for the disclosed use.

In the case of grounding straps, cables, and the like, such arrangements often employ a one megohm (1 ohm $\times 10^6$) resistor so as to limit the rate of discharge, and the adoption of such is herein contemplated.

In addition, to the disclosed grounding key and attached cable, the provision of a socket connected thereto, for the plugging in, in parallel therewith of a grounding wrist bracelet for use by the person handling the electronic components also is contemplated.

I claim:

1. An electrically conductive container, having:
   a body portion;
   a lid closure portion therefor;
   latch means for retaining the lid portion in secured relation to the body portion, making electrical contact with said body portion and said lid;
   key means for releasing the latch means,
   said key means making electrical contact with the latch means;
   ground cable means connected with the key means to remove any charge above ground potential, and
   whereby upon insertion of said key in said latch means to open said container said container is effectively grounded and any electrostatic charge thereon is removed.

2. The container as set forth in claim 1;
   said latch means having clip means secured to one said container portion, and
   grommet means secured to the other said container portion.

3. The container as set forth in claim 2;
   said latch means being secured to said container body portion, and
   said grommet means being secured to said lid portion.

4. The container as set forth in claim 3;
   said grommet means having an aperture therethrough for the passage of said key, and
   said clip means extending beyond said aperture to engage the remote edge of said grommet when in a closed condition, for disengagement therefrom upon insertion of said key in extended projecting relation through said grommet.

5. The container as set forth in claim 1;
   in combination with a shock-insulative lining, and
   said lining having an electrical conduction characteristic of predetermined value.

6. The container as set forth in claim 1;
   wherein said latch means comprises a tumbler-less lock.

7. The method of protecting sensitive solid state electronic components, comprising the steps of:
   inserting said components within a rigid electrically conductive container having a latch therefor electrically connected to said container;
   closing the container in latched securing relation with the components;
   subsequently inserting a key connected to a ground into said latch to thereby release any accumulated electrostatic charge from the container
   and also to contemporaneously permit the release of the latch,
   thereby permitting the container to be opened to access said components.

* * * * *